United States Patent
Nedovic (10) Patent No.: US 9,225,371 B2
(45) Date of Patent: Dec. 29, 2015

(54) OFFSET COMPENSATION FOR SERIAL LINKS

(71) Applicant: FUJITSU LIMITED, Kawasaki-shi, Kanagawa (JP)

(72) Inventor: Nikola Nedovic, San Jose, CA (US)

(73) Assignee: FUJITSU LIMITED, Kawasaki (JP)

( * ) Notice: Subject to any disclaimer, the term of this patent is extended or adjusted under 35 U.S.C. 154(b) by 8 days.

(21) Appl. No.: 14/194,297

(22) Filed: Feb. 28, 2014

(65) Prior Publication Data

US 2015/0249477 A1  Sep. 3, 2015

(51) Int. Cl.
| | |
|---|---|
| *H04L 7/00* | (2006.01) |
| *H04B 1/12* | (2006.01) |
| *H04L 27/156* | (2006.01) |

(52) U.S. Cl.
CPC .............. *H04B 1/123* (2013.01); *H04L 7/0016* (2013.01); *H04L 27/1566* (2013.01)

(58) Field of Classification Search
CPC .. H04B 1/123; H04L 7/0016; H04L 27/2647; H04L 27/1566
See application file for complete search history.

(56) References Cited

U.S. PATENT DOCUMENTS

| | | | | |
|---|---|---|---|---|
| 8,249,207 | B1* | 8/2012 | Hissen et al. ................. | 375/355 |
| 2005/0134305 | A1* | 6/2005 | Stojanovic et al. ............ | 326/31 |
| 2007/0006054 | A1* | 1/2007 | Fiedler ........................... | 714/709 |
| 2010/0146320 | A1* | 6/2010 | Chen et al. ..................... | 713/401 |
| 2010/0220828 | A1* | 9/2010 | Fuller et al. .................... | 375/355 |
| 2010/0289544 | A1* | 11/2010 | Lee et al. ....................... | 327/159 |
| 2011/0243215 | A1* | 10/2011 | Wu et al. ........................ | 375/233 |

OTHER PUBLICATIONS

G. Miao, P. Ju, D. Ng, J. Khoury and K. Lakshmikumar, "A fully-integrated 10.5 to 13.5 Gbps transceiver in 0.13uμm CMOS," in Custom Integrated Circuits Conference, 2003, p. 595.
S. McLeod et al., "A Digital Offset—Compensation Scheme for an LA and CDR in 65-nm CMOS", Symposium on VLSI Circuits, 2009, p. 16-17.
V. Stojaanovic et al., "Autonomous Dual-Mode (PAM2/4) Serial Link Transceiver With Adaptive Equalization and Data Recovery", IEEE JSSC, vol. 40, No. 4, Apr. 2005, p. 1012-1026.

* cited by examiner

*Primary Examiner* — Jean B Corrielus
(74) *Attorney, Agent, or Firm* — Maschoff Brennan (57) ABSTRACT

A method for compensating an offset in a receiver is provided. The method includes receiving first data from a first sampler and receiving second data from a second sampler. The method also include determining a first average value from the boundary of the first data over a selected period of time; and sending an offset signal to the first sampler based on the first average value. The method may also include determining a second average value from the boundary of the second data over a selected period of time; and sending an offset signal to the second sampler based on the second average value of the boundary data.

16 Claims, 8 Drawing Sheets

OFFSET COMPENSATION FOR SERIAL LINKS

FIELD

The embodiments discussed herein are related to offset compensation for serial links.

BACKGROUND

Serial receivers employ amplifiers and/or samplers whose input signals swing for a number of reasons. These offsets may be a function of environment, age, use, etc., and may vary slowly over time. These offsets may degrade receiver performance and in the extreme may saturate the output and possibly lead to receiver failure.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a method for compensating an offset in a receiver is provided. The method includes receiving first data from a first sampler and receiving second data from a second sampler. The method also include determining a first average value from the boundary of the first data over a selected period of time; and sending an offset signal to the first sampler based on the first average value. The method may also include determining a second average value from the boundary of the second data over a selected period of time; and sending an offset signal to the second sampler based on the second average value of the boundary data.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Serial communication receivers may employ a number of amplifiers and/or samplers whose input offset may be on the order of tens of millivolts for a number of reasons. This offset may be a function of process variation, environment, age, use, etc., and may vary slowly over time. These offsets may degrade receiver performance and in the extreme may saturate the output and possibly lead to receiver failure.

Offset compensation techniques and/or receivers that provide online offset compensation are disclosed in accordance with at least one embodiment described herein. These techniques and/or receivers may compensate for voltage offsets in amplifiers and/or samplers (or any other component) in a serial link without requiring additional samplers or amplifiers. Moreover, in accordance with at least one embodiment described herein, offset compensation may occur online. For example, offset compensation may occur while data samples are collected from an input signal. According to some embodiments described herein, these techniques and/or receivers may include a data sampler that generates data samples and a boundary sampler that generates boundary samples. These techniques and/or receivers may use information from the boundary samples to extract an offset of the boundary sampler and provide offset compensation of the amplifiers and/or samplers (or other components) using the extracted offset. After extracting the offset, the role of the data samplers and boundary samplers may be switched and the offset of the new boundary sampler may be extracted and applied.

Embodiments of the present invention will be explained with reference to the accompanying drawings.

Figure 1:
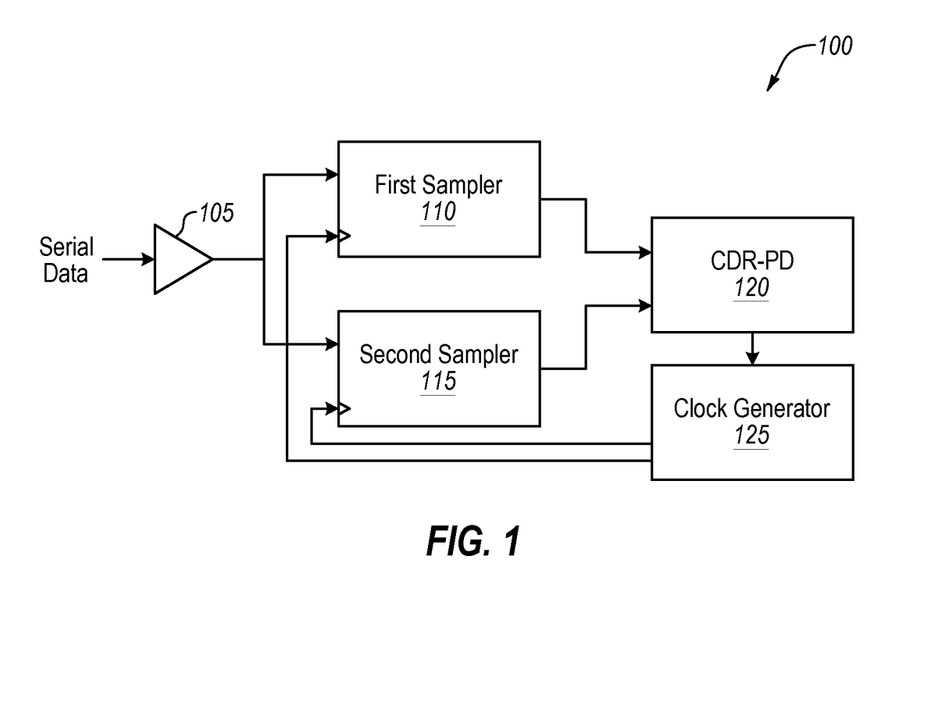
FIG. 1 is a block diagram of an example serial receiver according to at least one embodiment described herein.

FIG. 1 is a block diagram of an example receiver system 100 according to at least one embodiment described herein. The receiver system 100 may include any type of receiver such as, for example, an electrical wireline receiver, an optical receiver, a Wi-Fi receiver, a Bluetooth receiver, an LTE receiver, or any other digital communication receivers, such as receivers on printed circuit boards, integrated circuits, and other receivers.

The receiver system 100 may include an amplifier 105, a first sampler 110, a second sampler 115, a clock and data recovery circuit and/or phase detector (CDR-PD) 120, and a clock generator 125. The amplifier 105 may include any number of amplifiers. Similarly, any number of samplers may be used including the first sampler 110 and the second sampler 115.

Figure 2A:
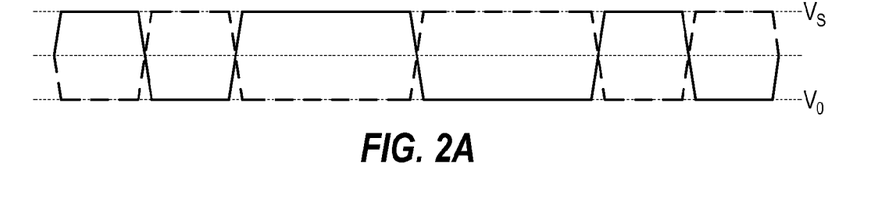
FIG. 2A illustrates an example timing diagram of a differential signal according to at least one embodiment described herein.

The amplifier 105 may be configured to receive a signal, such as a differential signal. The amplifier 105 may amplify the differential signal and provide the differential signal to the first sampler 110 and the second sampler 115. FIG. 2A illustrates an example timing diagram of a differential signal, according to at least one embodiment described herein. The differential signal may include a first signal, do, and second signal, dox, respectively, that may vary between two voltages, $V_S$ and $V_0$. For example, $V_0$ may be zero volts and $V_S$ may be near or less than 1 volt. As another example, $V_S$ may be 500 mV and $V_0$ may be −500 mV. Other voltage levels may be used as well. The first signal and the second signal (do and dox) may be complements of one another: one signal may be asserted while the other is not and vice versa.

Returning to FIG. 1, the first sampler 110 and/or the second sampler 115 may include a number of different components and/or circuits. The first sampler 110 and/or the second sampler 115 may include, for example, a comparator that compares a voltage of the first signal and second signal of the differential signal at the rising edge and/or falling edge of a clock provided to each of the first sampler 110 and the second sampler 115. In some embodiments, the first sampler 110 may be configured to receive a first clock from the clock generator 125, and the second sampler 115 may be configured to receive a second clock from the clock generator 125. In some embodiments, the first clock and the second clock may have the same frequency but a different phase. Alternately or additionally, the first clock and the second clock may have a similar frequency and phase. For example, the first clock may be out of phase with the second clock by 90, 180, or 270 degrees, or by some other amount.

Based on the comparison of the voltage of first signal to the voltage of the second signal, the first sampler 110 and the second sampler 115 may send digital data representing the comparison to the CDR-PD 120. For example, when the comparison between the voltages of first signal to the voltage of the second signal indicates that the voltage of the first signal is larger than the voltage of the second signal, the first sampler 110 and/or the second sampler 115 may output digital data representing a digital one (e.g., an asserted bit). Alternately, when the comparison between the voltages of first signal to the voltage of the second signal indicates that the voltage of the first signal is smaller than the voltage of the second signal, the first sampler 110 and/or the second sampler 115 may output digital data representing a digital zero (an unasserted bit).

In some embodiments, when the first clock and the second clock have the same frequency but a different phase, one of the first clock and the second clock may cause one of the first sampler 110 and the second sampler 115 to sample the differential signal when the first signal and the second signal of the differential signal are transitioning and at other times. The clock signal of the first clock and/or the second clock that may cause one of the first sampler 110 and the second sampler 115 to sample the differential signal when the first and second signals of the differential signal are transitioning may be referred to as a boundary clock. The first and second signals may be transitioning, when the first signal is changing from being $V_S$ to $V_0$ and the second signal is changing from being $V_0$ to $V_S$, and/or vice-versa. The digital data sampled using the boundary clock may be referred to as boundary data. The one of the first sampler 110 and the second sampler 115 that samples using the boundary clock may be referred to herein as the boundary sampler.

The other of the first clock and the second clock may cause one of the first sampler 110 and the second sampler 115 to sample the differential signal approximately half-way between transitions of the first and second signals of the differential signal. The clock signal of the first clock and/or the second clock that may cause one of the first sampler 110 and the second sampler 115 to sample the differential signal approximately half-way between transitions of the first and second signals of the differential signal may be referred to as a data clock. The digital data sampled using the data clock may be referred to as the data of the differential signal or simply data The one of the first sampler 110 and the second sampler 115 that samples using the data clock may be referred to herein as the data sampler.

Figure 2B:
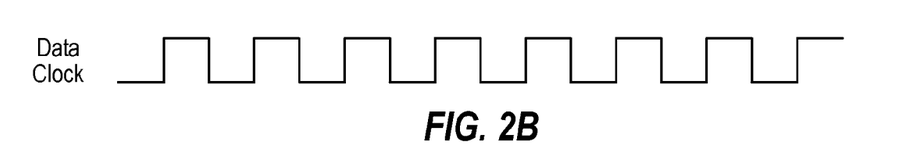
FIG. 2B illustrates an example timing diagram of a data clock according to at least one embodiment described herein.
Figure 2C:
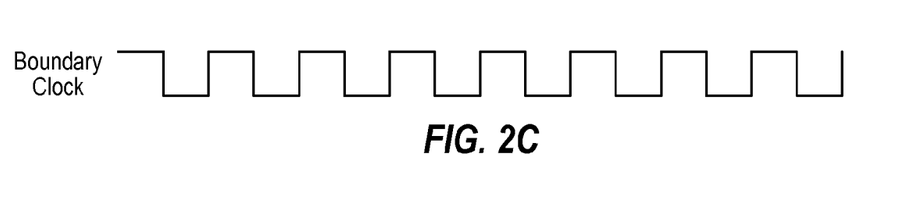
FIG. 2C illustrates an example timing diagram of a boundary clock according to at least one embodiment described herein.

FIG. 2B illustrates an example timing diagram of a data clock and FIG. 2C illustrates an example timing diagram of a boundary clock, according to at least one embodiment described herein. As illustrated by referencing FIGS. 2A and 2B, the rise of the data clock occurs in the middle of a data bit of the differential signal illustrated in FIG. 2A. As illustrated by referencing FIGS. 2A and 2C, some rises of the boundary clock occurs at the boundary of the differential signal illustrated in FIG. 2A. As noted above, one of the first sampler 110 and the second sampler 115 may be selected as the boundary sampler and may be clocked using the boundary clock illustrated in the timing diagram of FIG. 2C. The other sampler may be used to sample the data and may be clocked using the data clock illustrated in the timing diagram of FIG. 2B.

Returning to FIG. 1, the first sampler 110, the second sampler 115, and/or the amplifier 105 may be subject to voltage offsets. For example, the first sampler 110 may include a comparator that compares a voltage of the first signal of the differential signal to a voltage of the second signal of the differential signal. When the first sampler 110 has no offset, the first sampler 110 may output a digital one when sampled after the voltage levels of the first and second signal cross as illustrated in FIG. 2A. When the first sampler 110 has an offset, for example, an offset of 100 millivolts (mV), the first sampler 110 may output a digital one when sampled after the voltage of the first signal plus 100 mV exceeds the voltage of the second signal. These offsets may vary over time and may be as much as, for example, ±5 mV, ±10 mV ±50 mV, ±100 mV, etc.

Offsets in the boundary sampler may result in the boundary data being different then if the boundary sampler did not have an offset. For example, when the first sampler 110 is the boundary sampler and has no or little offset, the first sampler 110 may sample the differential signal when the boundary clock (see FIG. 2C) rises. As a result, the first sampler 110 may sample the differential signal at the boundary, when the first and second signals are transitioning. In particular, the first sampler 110 may sample the differential signal when the first and second signals are approximately equal. Because of jitter, noise, phase misalignment of the boundary clock and other variables, the first sampler 110 may sometimes output digital zero or a digital one. Over time, an average of the digital data outputs of the first sampler 110 may approximately equal one-half (½). In some embodiments, the average of the digital data outputs of the first sampler 110 may vary by plus or minus 5%, 10%, 15% or 20%. In contrast, when the first sampler 110 is the boundary sampler and has a positive offset, the first sampler 110 may sample at the boundary of the differential signal and may more often output a digital one than a digital zero because the voltage of the first signal plus the positive offset may be greater than the voltage of the second signal when the sampling occurs. As a result, an average of the digital data outputs of the first sampler 110 may not approximately equal one-half, but may be greater than one-half. Alternately, with a negative offset, the first sampler 110 sampling at the boundary of the differential signal may more often output a digital zero than a digital one. As a result, an average of the digital data outputs of the first sampler 110 may be less than one-half.

The CDR-PD 120 may include edge detection circuitry, phase-lock-loop circuitry, linear phase detectors, binary phase detectors, rotational phase detectors, quadricorrelators, etc. The CDR-PD 120 may be configured to input digital data sampled by the first sampler 110 and the second sampler 115. In some embodiments, the digital data from one of the two samplers may be boundary data and the other digital data may be data. By detecting a phase difference between when the boundary data is received and the data is received, the CDR-PD 120 may determine information for adjusting the phase and/or frequency of the boundary clock and the data clock provided to the first sampler 110 and the second sampler 115. In some embodiments, the CDR-PD 120 may also input data from any number of other samplers and may use at least one of the sampler's data as the boundary data.

The CDR-PD 120 may output a clock adjustment signal to the clock generator 125 that may indicate adjustments for the boundary clock and the data clock so that the frequency and phase of the boundary clock may be aligned with the differential signal and/or so that the frequency of the data clock is aligned with the differential signal, but the phase of the data clock may be offset from the phase of the differential signal. For example, the clock generator 125 may include a voltage-controlled oscillator and the CDR-PD 120 may output a voltage that may be used by the voltage-controlled oscillator to synchronize the boundary clock to the frequency and phase of the differential signal.

Figure 2D:
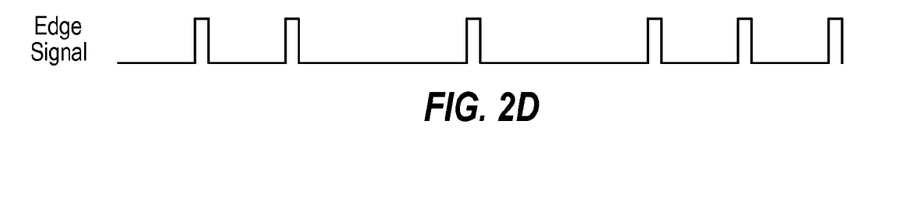
FIG. 2D illustrates an example timing diagram of an edge signal according to at least one embodiment described herein.

In some embodiments, the CDR-PD 120 may also output an edge signal as illustrated in FIG. 2D. The edge signal may or may not be used in embodiments described herein. The edge signal, for example, may indicate where the signal transitions form high values to low values or from low values to high values. As illustrated in FIGS. 2A and 2D, the edge signal is asserted when the signal in FIG. 2A transitions between high and low values. Embodiments described herein use boundary data sampled at these transitions to determine offset compensation for the amplifier 105, the sampler 110, and/or the sampler 115.

In some embodiments, because the boundary data is sampled on the boundary clock, the boundary data includes some data that is sampled during transitions and some data that is not sampled during transitions. For example, when the differential signal is asserted for multiple contiguous clock cycles no transitions occur and the boundary data includes samples of the differential signal that is not part of a transition. The edge signal may be used to indicate the portions of the boundary data that represents transitions in the differential signal. These portions of the boundary data may be averaged over time and used for offset compensation.

Figure 3:
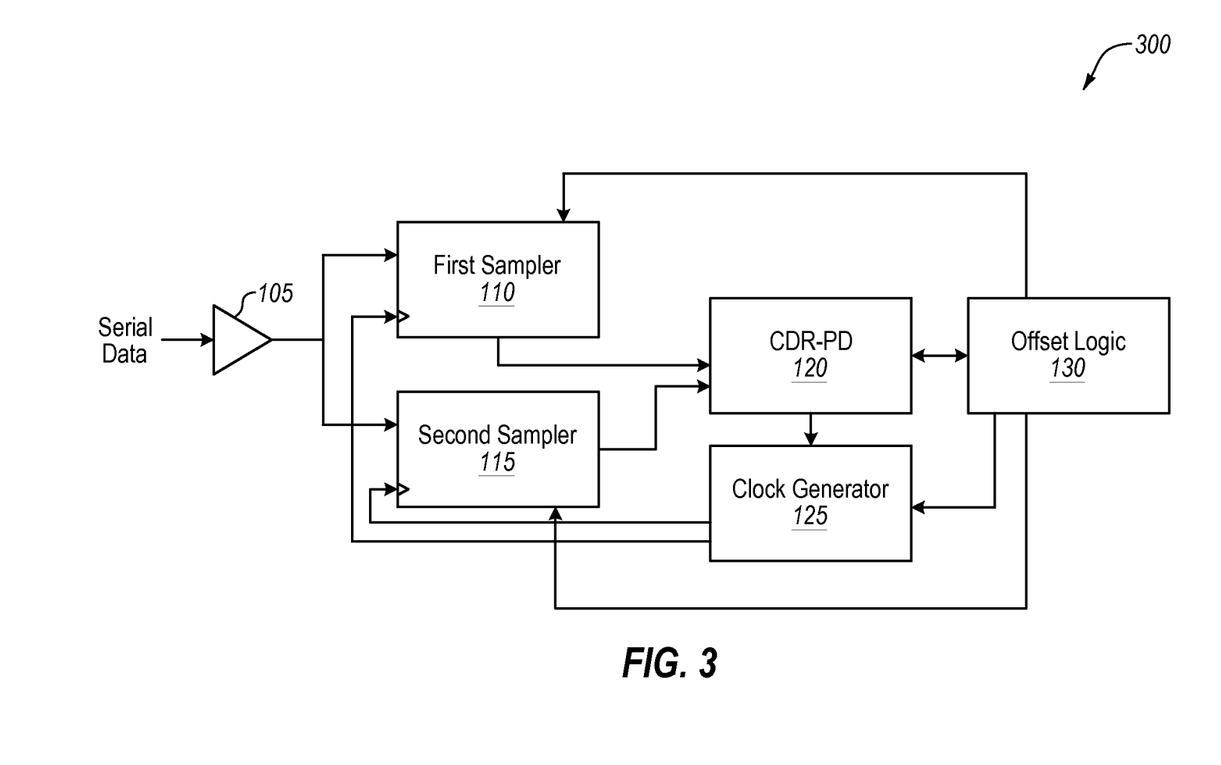
FIG. 3 is a block diagram of an example serial receiver according to at least one embodiment described herein.

FIG. 3 is a block diagram of an example receiver 300, according to at least one embodiment described herein. The receiver 300 includes offset logic 130 coupled with the CDR-PD 120, the clock generator 125, the first sampler 110, and the second sampler 115. The offset logic 130 may receive boundary data from the CDR-PD 120 and may determine an offset by averaging the boundary data.

The offset logic 130 may also include logic that indicates to the CDR-PD 120 which data of the data from the first sampler 110 and/or the second sampler 115 (or any other samplers) to use as the boundary data. Additionally or alternatively, the offset logic 130 may also send a signal to the clock generator 125 specifying whether to send the data clock or the boundary clock to the first sampler 110 or the second sampler 115 (or any other samplers). The offset logic 130 may include memory, logic, and/or a controller. Moreover, the CDR-PD 120 and the offset logic 130, for example, may be part of the same component or circuitry.

Figure 4:
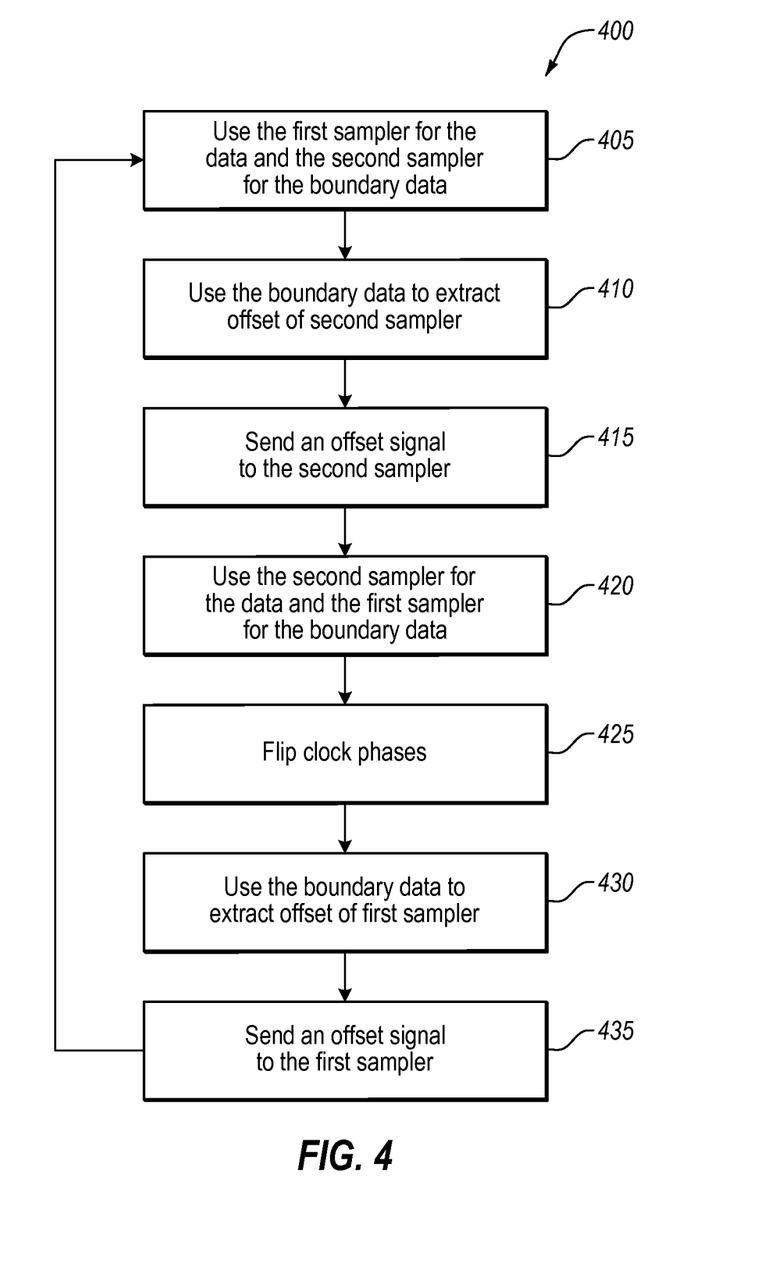
FIG. 4 is a flowchart of an example online process for correcting offset of a sampler according to at least one embodiment described herein.
Figure 5:
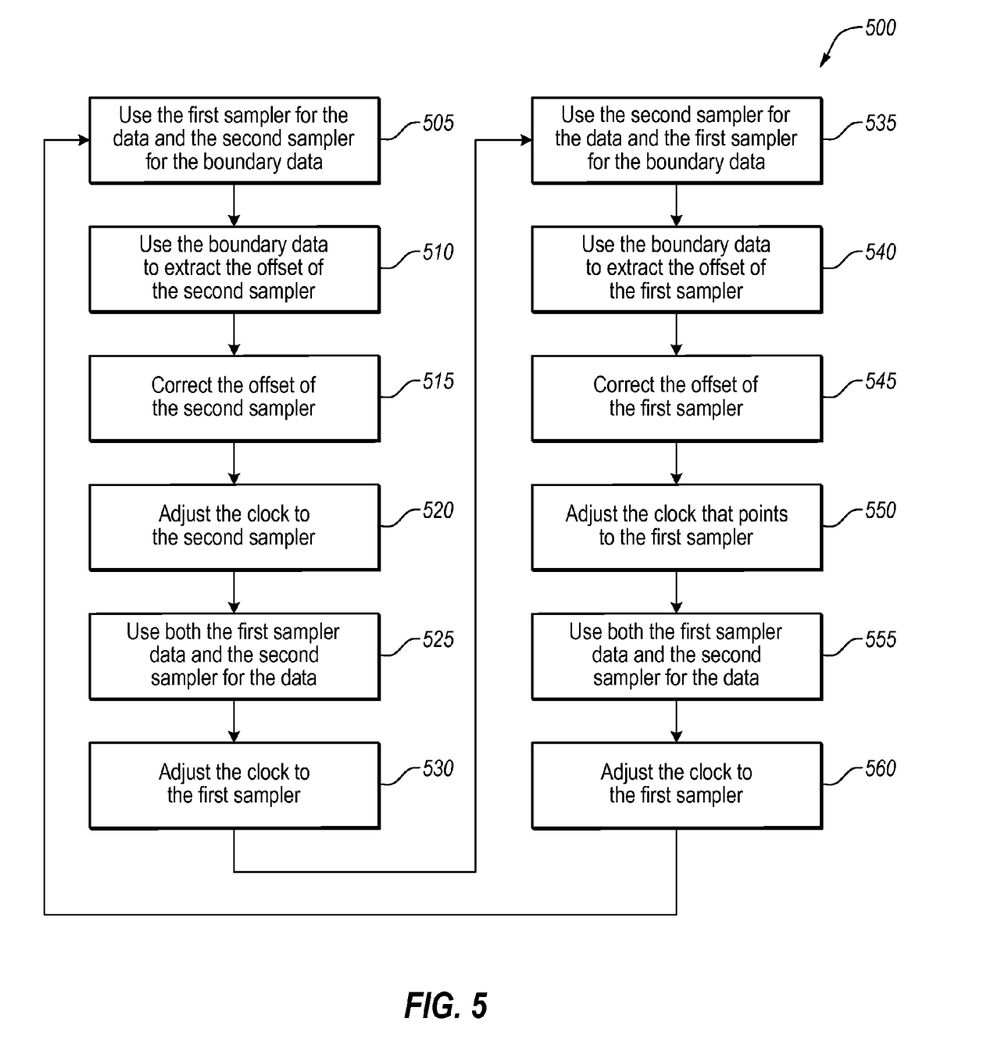
FIG. 5 is another flowchart of an example online process for correcting offset of a sampler according to at least one embodiment described herein.
Figure 6:
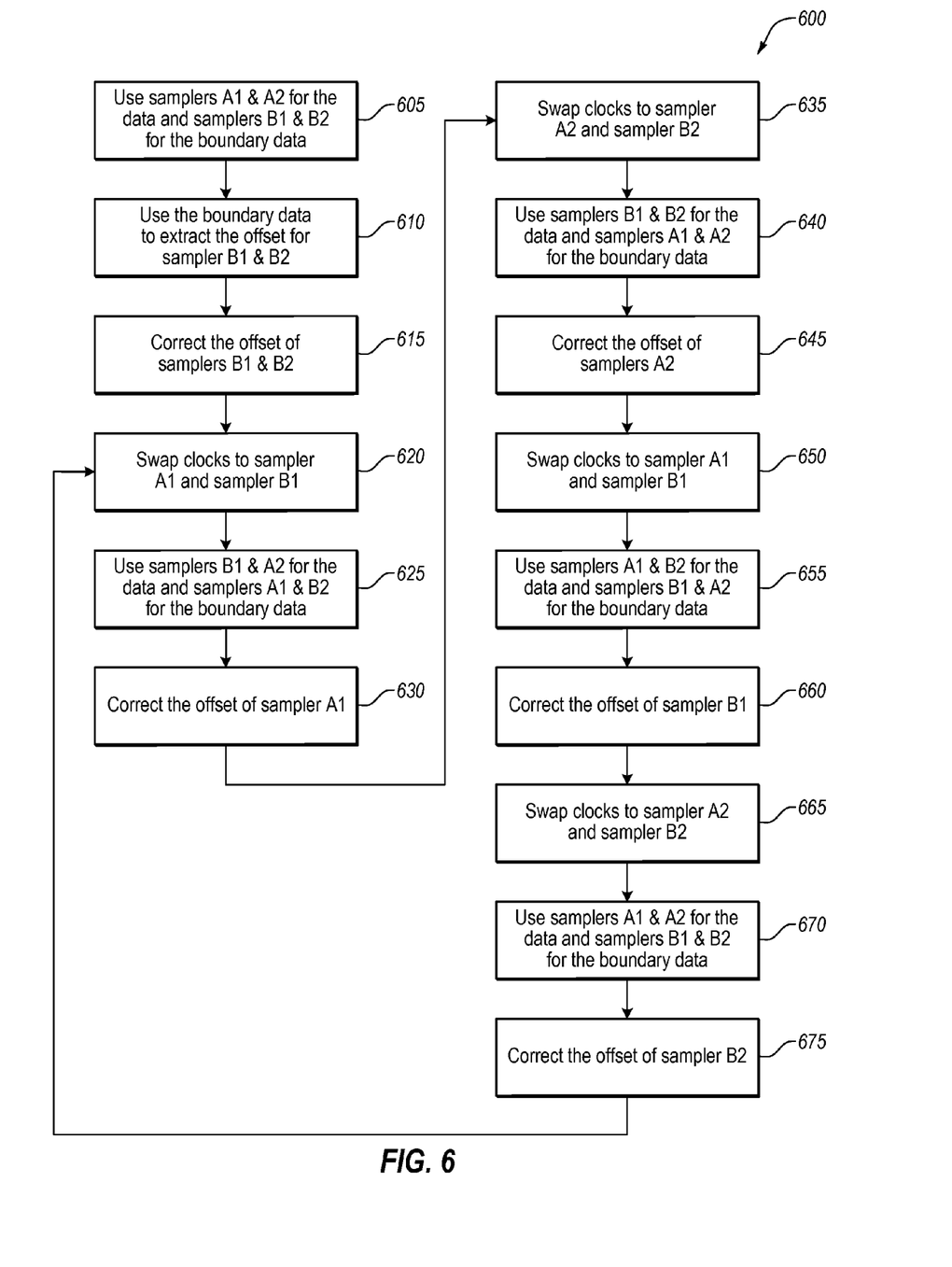
FIG. 6 is a flowchart of an example process for correcting offsets using four samplers according to some embodiments described herein.
Figure 7:
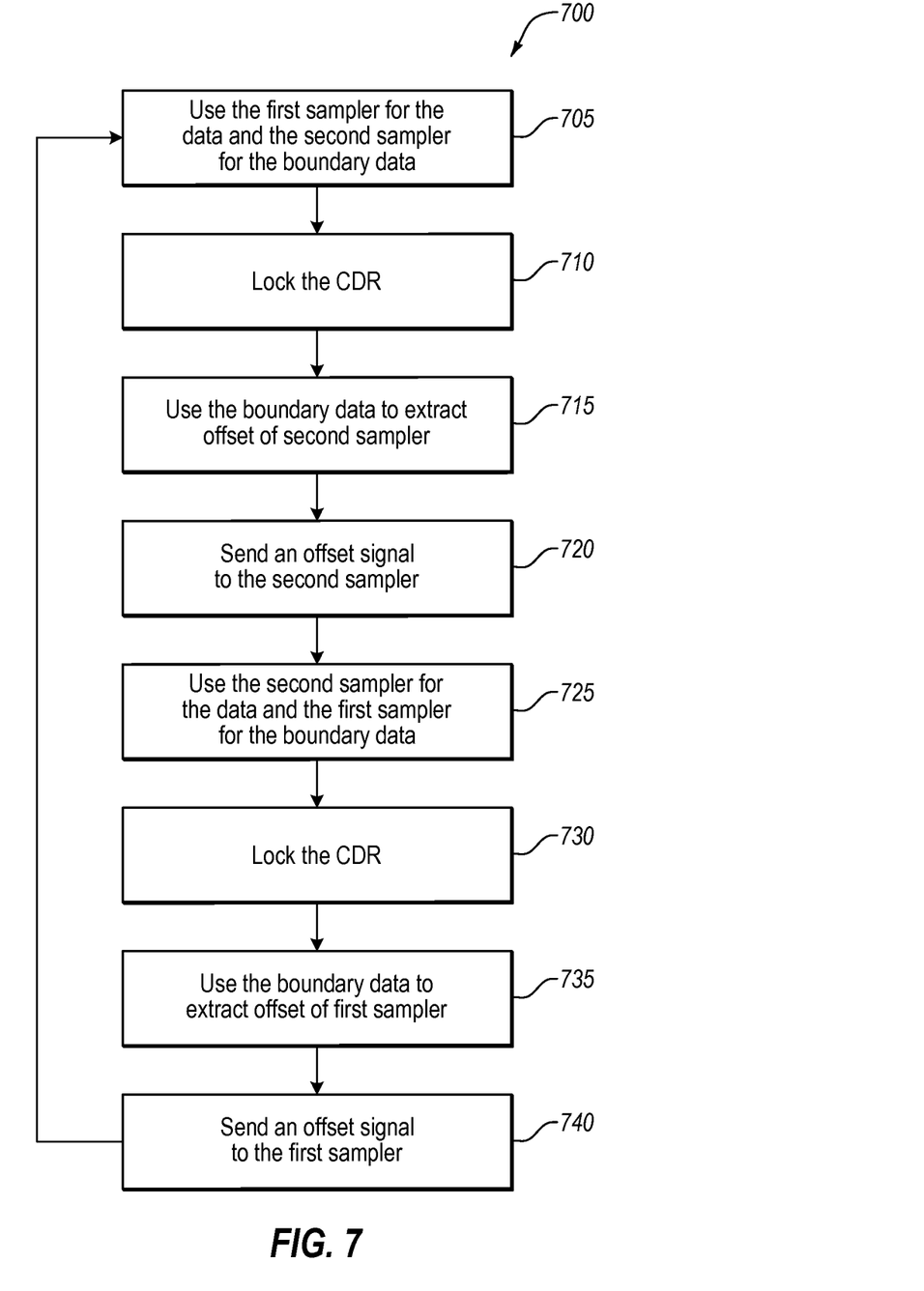
FIG. 7 is another flowchart of an example online process for correcting offset of a sampler according to at least one embodiment described herein.

The offset logic 130 alone or in conjunction with other components (e.g., the other components of receiver 400) may also perform all or portions of process 400 illustrated in FIG. 4, process 500 illustrated in FIG. 5, process 600 illustrated in FIG. 6, or process 700 illustrated in FIG. 7.

FIG. 4 is a flowchart of an example process 400 for correcting offset of a sampler, according to at least one embodiment described herein. At block 405, the data sampled by the first sampler 110 may be used for the data and the data sampled by the second sampler 115 may be used for the boundary data. For example, the offset logic 130 may send a signal to the CDR-PD 120 that indicates that the data sampled by the first sampler 110 may be set as data and the data sampled by the second sampler 115 may be set as the boundary data. The CDR-PD 120 may send the boundary data to the offset logic 130.

Since the data sampled by the second sampler 115 is the boundary data, the clock generator 125 may send the boundary clock (e.g., FIG. 2C) to the second sampler 115 and the data clock (e.g., the data clock illustrated in FIG. 2B) to the first sampler 110. For example, the offset logic 130 may send a signal to the clock generator 125 indicating which sampler to send the data clock and which sampler to send the boundary clock.

At block 410, the offset logic 130 may average the boundary data over a selected period of time. The boundary data, for example, may be averaged over a selected period of time or a selected number of clock cycles.

At block 415 the offset of the second sampler 115 may be compensated based on whether the average value of the boundary data is greater than or less than one-half. For example, if the offset logic 130 determines that the average value of the boundary data is asserted is greater than one-half, then the offset logic 130 may send a signal to the second sampler 115 to adjust the sampler by a selected negative amount. As another example, if the offset logic 130 determines that the average value of the boundary data is asserted is less than one-half, then the offset logic 130 may send a signal to the second sampler 115 to adjust the sampler by a selected positive amount. The selected negative amount and/or positive amount, for example, may be ±1 mV, ±5 mV, ±10 mV, ±50 mV, ±100 mV, ±200 mV, etc. As yet another example, the offset logic 130 may indicate an offset value to the second sampler 115 that is proportional to a difference between the average value of the boundary data is asserted and one-half.

Alternatively or additionally, the offset of the first sampler 110 may also be compensated based on the comparison of the average value of the boundary data is asserted. For example, if the offset logic 130 determines that the average value of the boundary data is asserted is greater than one-half, then the offset logic 130 may send a signal to the first sampler 110 to adjust the sampler by a selected negative amount. As another example, if the offset logic 130 determines that the average value of the boundary data is asserted is less than one-half, then the offset logic 130 may send a signal to the first sampler 110 to adjust the sampler by a selected positive amount. The selected negative amount and/or positive amount, for example, may be ±1 mV, ±5 mV, ±10 mV, ±50 mV, ±100 mV, ±200 mV, etc. As another example, the offset logic 130 may indicate an offset value to the first sampler 110 that is proportional to a difference between the average value of the boundary data is asserted and one-half.

At block 420 the first sampler 110 and the second sampler 115 may be swapped. For example, the data sampled by the first sampler 110 may be used for the boundary data and the data sampled by the second sampler 115 may be used as data.

For example, the offset logic 130 may send a signal to the CDR-PD 120 that indicates that the data sampled by the second sampler 115 may be used for data and the data sampled by the first sampler 110 may be used for the boundary data. The CDR-PD 120 may then send the data sampled by the first sampler 110 as the boundary data to the offset logic 130, and/or send the edge signal recovered from the boundary data to the offset logic 130.

At block 425 the boundary clock may be sent to the first sampler 110 and the data clock may be sent to the second sampler 115. For example, the offset logic 130 may send a signal to the clock generator 125 that indicates the boundary clock may be sent to the first sampler 110 and the data clock may be sent to the second sampler 115. Blocks 420 and 425 may occur in any order and may occur simultaneously. As another example, the phases of the clocks sent to the respective samplers may be shifted by ninety degrees.

According to at least one embodiment described herein, block 425 may be skipped. This block may be skipped, for example, if the clock generator 125 does not support clock flipping. As another example, block 425 may be skipped when the CDR-PD 120 has been locked to a specific clock frequency. Alternatively, block 425 may be skipped for any other reason.

Alternatively or additionally, in some embodiments, after block 425, the offset logic 130 and/or CDR-PD 120 may pause for a set period of time to allow any transient issues to settle that may occur when flipping the clocks. The time for the transient issues to settle may depend on the frequency of the differential signal, jitter, and noise, among others. In one example, the receiver 300 may pause for 100 milliseconds. Alternatively or additionally, the receiver 300 may pause for a selected number of clock cycles.

Figure 8A:
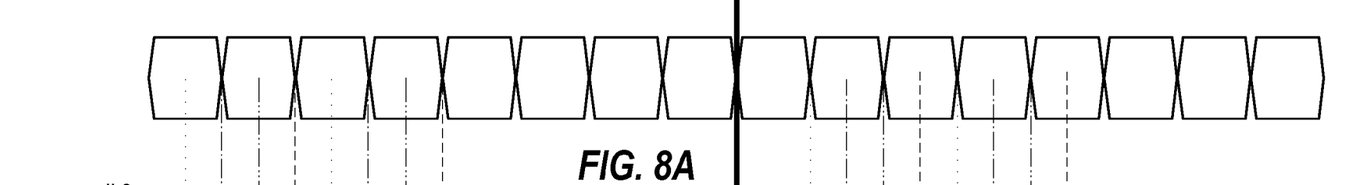
FIG. 8A illustrates an example timing diagram of a differential signal according to at least one embodiment described herein.
Figure 8B:
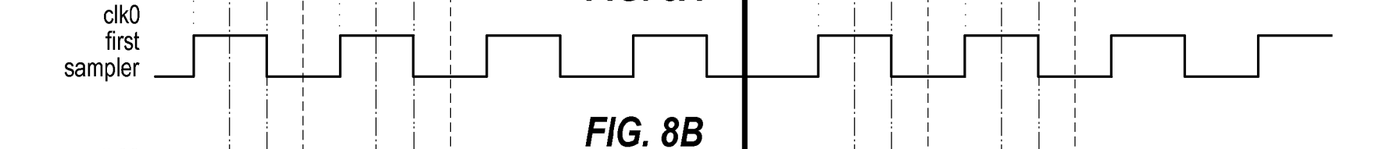
FIGS. 8B, 8C, 8D and 8E illustrate different clocks that are ninety degrees out of phase relative to neighboring clocks according to at least one embodiment described herein.
Figure 8C:
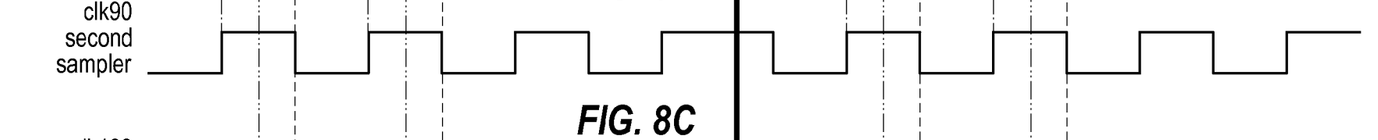
Figure 8D:
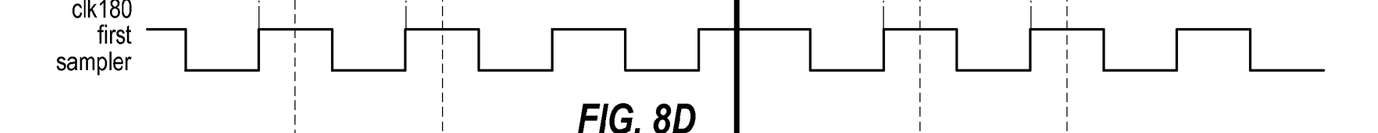
Figure 8E:
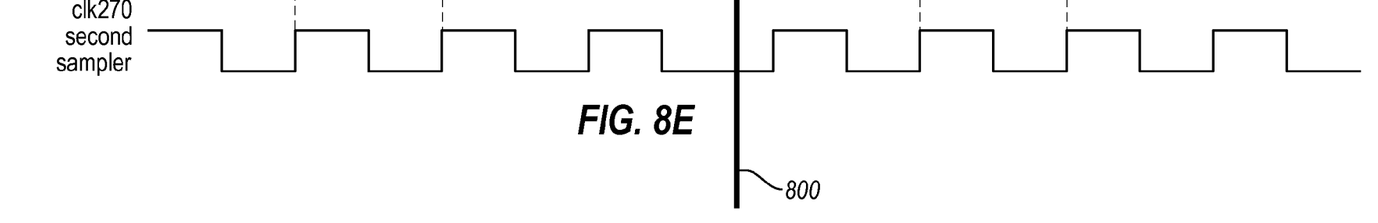

Alternatively, in some embodiments, a pause for a set period of time may not be needed following block 425. For instance, the clock phases may be changed implemented in a single cycle in a synchronized and glitch-less manner. Each data bit, for example, may be captured by exactly one clock phase and/or no bits may be missed. This may result in no increase to the bit error rate of the receiver. This is illustrated, for example, in FIGS. 8A, 8B, 8C, 8D and 8E. As illustrated in the figure, at time 805 the phase of each clock is shifted by 90°. FIG. 8B shows a clock and FIG. 8C shows a boundary clock for the first sampler 110. FIG. 8D shows a clock and FIG. 8E shows a boundary clock for the second sampler 115. The shift can be made to transition a sampler from boundary mode to data mode.

At block 430, the offset logic 130 may average the boundary data over a selected period of time or a selected number of clock cycles.

At block 435 the offset of the first sampler 110 may be compensated based on whether the average value of the boundary data is asserted is greater than or less than one-half. For example, if the offset logic 130 determines that the average value of the boundary data is asserted is greater than one-half, then the offset logic 130 may send a signal to the first sampler 110 to adjust the sampler by a selected negative amount. As another example, if the offset logic 130 determines that the average value of the boundary data is asserted is less than one-half, then the offset logic 130 may send a signal to the first sampler 110 to adjust the sampler by a selected positive amount. The selected negative amount and/or positive amount, for example, may be ±1 mV, ±5 mV, ±10 mV, ±50 mV, ±100 mV, ±200 mV, etc. As yet another example, the offset logic 130 may indicate an offset value to the first sampler 110 that is proportional to a difference between the average value of the boundary data is asserted and one-half.

Alternatively or additionally, the offset of the second sampler 115 may also be compensated based on the comparison of the average value of the boundary data is asserted. For example, if the offset logic 130 determines that the average value of the boundary data is asserted is greater than one-half, then the offset logic 130 may send a signal to the second sampler 115 to adjust the sampler by a selected negative amount. As another example, if the offset logic 130 determines that the average value of the boundary data is asserted is less than one-half, then the offset logic 130 may send a signal to the second sampler 115 to adjust the sampler by a selected positive amount. The selected negative amount and/or positive amount, for example, may be ±1 mV, ±5 mV, ±10 mV, ±50 mV, ±100 mV, ±200 mV, etc. As another example, the offset logic 130 may indicate an offset value to the second sampler 115 that is proportional to a difference between the average value of the boundary data is asserted and one-half.

After block 435, process 400 may return to block 405. Alternatively or additionally, process 400 may be interrupted or stopped for any number of reasons.

FIG. 5 is a flowchart of an example process 500 for correcting offset of a sampler, according to at least one embodiment described herein. Process 500, for example, may be executed by receiver 300 illustrated in FIG. 3. Some of the blocks of process 500 may be similar to blocks of process 400 illustrated in FIG. 4.

Process 500 may start at block 505, which may be similar to block 405 illustrated in FIG. 4. At block 505, for example, the data sampled by the first sampler 110 may be used for the data and the data sampled by the second sampler 115 may be used for the boundary data.

Block 510 may be similar to block 410 illustrated in FIG. 4. At block 510, the boundary data may be used to extract the offset for the second sampler 115 as described herein. Block 515 may be similar to block 415 illustrated in FIG. 4. At block 515 the offset of the second sampler 115 may be corrected. For example, a signal may be sent to the second sampler 115 indicating the magnitude and/or direction of the offset.

At block 520, the clock to the second sampler 115 may be adjusted so that it is aligned to collect data rather than boundary data. For instance, the phase of the clock to the second sampler 115 may be aligned with the clock to the first sampler 110.

At block 525, data from both the first sampler 110 and the second sampler 115 may be used as the data. For instance, after the offset of the second sampler 115 has been compensated, the process may enter a data collection state and data from both the first sampler 110 and the second sampler 115 may be used as data.

At block 530, the clock to the first sampler 110 may be adjusted so that the first sampler 110 samples the boundary. For instance, prior to block 530, the first sampler 110 may use the clock in FIG. 2B, and may change to the clock in FIG. 2C at block 530. In some embodiments, process 500 may wait a predetermined or selected period of time prior to proceeding to block 530.

Block 535 may be similar to block 420 in FIG. 4. At block 535, the data sampled by the second sampler 115 may be used for the data and the data sampled by the first sampler 110 may be used for the boundary data.

Block 540 may be similar to block 430. At block 540, the boundary data collected from the first sampler 110 may be used to extract the offset of the sampler as discussed elsewhere herein. At block 545, the offset of the first sampler 110 may be corrected. For example, a signal may be sent to the first sampler 110 indicating the magnitude and/or direction of the offset.

At block 550, the clock to the first sampler 110 may be adjusted so that it is aligned to collect data rather than boundary data. For instance, the phase of the clock to the first sampler 110 may be aligned with the clock to the second sampler 115.

At block 555, data from both the first sampler 110 and the second sampler 115 may be used as the data. For instance, after the offset of the second sampler 115 has been compensated, the process may enter a data collection state and data from both the first sampler 110 and the second sampler 115 may be used as data.

At block 560, the clock to the second sampler 115 may be adjusted so that the second sampler 115 samples the boundary. For instance, prior to block 560, the second sampler 115 may use the clock in FIG. 2B, and may change to the clock in FIG. 2C at block 530. In some embodiments, process 500 may wait a predetermined or selected period of time prior to proceeding to block 560.

Following block 530, process 500 may return to block 505. Process 500 may end at any time. For example, process 500 may end after block 555 or 560.

FIG. 6 is a flowchart of an example process 600 for correcting offsets using four samplers according to some embodiments described herein. While four samplers are described, process 600 may be expanded to any number of samplers or components. Process 600 starts at block 605. Sampler A1 and sampler A2 may be used to sample data from the signal and sampler B1 and sampler B2 may be used to sample the boundary of the signal. These samplers may be selected and/or labeled in any order or configuration. Moreover, sampler A1 and sampler A2 may use the clock illustrated in FIG. 2B and sampler B1 and sampler B2 may use the boundary clock illustrated in FIG. 2C.

At block 610 the offsets for sampler B1 and sampler B2 may be determined from the boundary of the signal according to various embodiments described herein and, at block 615; these offsets may be corrected in sampler B1 and sampler B2.

At block 620 the clocks to sampler A1 and sampler B1 may be swapped. For example, sampler A1 may now use the boundary clock illustrated in FIG. 2C and sampler B1 may use the clock illustrated in FIG. 2B.

At block 625, sampler B1 and sampler A2 may be used to sample data from the signal and sampler A1 and sampler B2 may be used to sample the boundary of the signal.

At block 630, the offset for sampler A1 may be corrected. The offset may be determined from the boundary of the signal according to various embodiments described herein.

At block 635 the clocks to sampler A2 and sampler B2 may be swapped. For example, sampler A2 may now use the boundary clock illustrated in FIG. 2C and sampler B2 may use the clock illustrated in FIG. 2B.

At block 640, sampler B1 and sampler B2 may be used to sample data from the signal and sampler B1 and sampler B2 may be used to sample the boundary of the signal.

At block 645, the offset for sampler A2 may be corrected. The offset may be determined from the boundary of the signal according to various embodiments described herein.

At block 650 the clocks to sampler A1 and sampler B1 may be swapped. For example, sampler B1 may now use the boundary clock illustrated in FIG. 2C and sampler A1 may use the clock illustrated in FIG. 2B.

At block 655, sampler A1 and sampler B2 may be used to sample data from the signal and sampler B1 and sampler A2 may be used to sample the boundary of the signal.

At block 660, the offset for sampler B1 may be corrected. The offset may be determined from the boundary of the signal according to various embodiments described herein.

At block 665 the clocks to sampler A2 and sampler B2 may be swapped. For example, sampler B2 may now use the boundary clock illustrated in FIG. 2C and sampler A2 may use the clock illustrated in FIG. 2B.

At block 670, sampler A1 and sampler A2 may be used to sample data from the signal and sampler B1 and sampler B2 may be used to sample the boundary of the signal.

At block 675, the offset for sampler B2 may be corrected. The offset may be determined from the boundary of the signal according to various embodiments described herein.

Process 600 may then return to block 620. Process 600 may end at any time.

FIG. 7 is a flowchart of an example process 700 for correcting offsets, according to at least one embodiment described herein. Process 700, for example, may be executed at least in part by the receiver 300 illustrated in FIG. 3. Process 700 begins at block 705, which may be similar to block 405 in FIG. 4. At block 705, data sampled by the first sampler 110 may be used for data and the data sampled by the second sampler 115 may be used for the boundary data. At block 710, a CDR, for example, within the CDR-PD 120 may be locked by extracting timing from and locking the timing to the boundary data. The CDR may be locked using any technique known in the art or used by a CDR.

Block 715 may be similar to block 410, block 720 may be similar to block 415, and block 725 may be similar to block 420 all of process 400 in FIG. 4. At block 725, data sampled by the second sampler 115 may be used for data and the data sampled by the first sampler 110 may be used for the boundary data.

At block 730, the CDR may be locked again using the first sampler 110 data as the new boundary data. Block 735 may be similar to block 430 in FIG. 4 and block 740 may be similar to block 435 in FIG. 4. After block 740, process 700 may return to block 705 where the process is repeated.

Alternatively or additionally, in any of processes illustrated in FIGS. 5, 6, 7, and 8 the process may perform offset compensation for one sampler based on the rate of change of the offset of another sampler. For example, during offset compensation on the second sampler 115 an initial offset may be noted for the second sampler 115. Then offset compensation may shift to the first sampler 110 and an initial offset may be noted for the first sampler 110. Offset compensation may occur for a selected period of time (or indefinitely) for the first sampler 110. It may be assumed that the second sampler 115 is subject to the same environmental conditions as the first sampler 110. The offset of the second sampler 115, therefore, may be assumed to change over time in a manner similar to the first sampler 110. The offset compensation for the second sampler 115 may be determined based on the rate of change of the first sampler 110 and the initial offset of the second sampler 115.

The embodiments described herein, in particular, the offset logic 130, may include the use of a special purpose or general purpose computer including various computer hardware or software modules, as discussed in greater detail below.

Embodiments described herein may be implemented using computer-readable media for carrying or having computer-executable instructions or data structures stored thereon. Such computer-readable media may be any available media that may be accessed by a general purpose or special purpose computer. By way of example, and not limitation, such computer-readable media may include tangible computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general purpose or special purpose computer. Combinations of the above may also be included within the scope of computer-readable media.

Computer-executable instructions may include, for example, instructions and data which cause a general purpose computer, special purpose computer, or special purpose processing device (e.g., one or more processors) to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the terms "module" or "component" may refer to specific hardware implementations configured to perform the operations of the module or component and/or software objects or software routines that may be stored on and/or executed by general purpose hardware (e.g., computer-readable media, processing devices, etc.) of the computing system. In some embodiments, the different components, modules, engines, and services described herein may be implemented as objects or processes that execute on the computing system (e.g., as separate threads). While some of the system and methods described herein are generally described as being implemented in software (stored on and/or executed by general purpose hardware), specific hardware implementations or a combination of software and specific hardware implementations are also possible and contemplated. In this description, a "computing entity" may be any computing system as previously defined herein, or any module or combination of modulates running on a computing system.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A method for compensating an offset in a receiver, the method comprising:
   receiving first data from a first sampler;
   receiving second data from a second sampler;
   determining a first average value from a boundary of the first data over a first selected period of time;
   sending a first offset signal to the first sampler based on the first average value;
   determining a second average value from a boundary of the second data over a second selected period of time;
   sending a second offset signal to the second sampler based on the second average value;
   generating a data clock based on either the boundary of the first data, the boundary of the second data, or both;
   generating a boundary clock that is out of phase with the data clock;
   sending the data clock to the first sampler; and
   sending the boundary clock to the second sampler.

2. The method according to claim 1, wherein the boundary clock is 180° out of phase with the data clock.

3. The method according to claim 1, further comprising simultaneously sending the data clock to the second sampler and the first sampler.

4. The method according to claim 1, further comprising:
   determining whether the first average value is greater than one-half; and
   in the event the first average value is greater than one-half, sending a third offset signal to the second sampler indicating that the second sampler should be compensated by a selected negative amount.

5. The method according to claim 1, further comprising:
   determining whether the first average value is less than one-half; and
   in the event the first average value is less than one-half, sending a third offset signal to the second sampler indicating that the second sampler should be compensated by a selected positive amount.

6. The method according to claim 1, further comprising sending a third offset signal to the first sampler based on the first average value.

7. The method according to claim 1, further comprising:
   determining a third average value of the first data over a selected period of time; and
   sending a third offset signal to the first sampler based on the third average value.

8. The method according to claim 7, further comprising sending a fourth offset signal to the second sampler based on the third average value.

9. The method according to claim 1, wherein:
   the data clock is generated further based on a first portion of the first data and a first portion of the second data; and
   after a period of time, the data clock is generated further based on a second portion of the first data and a second portion of the second data.

10. The method according to claim 1, wherein the boundary of the first data comprises digital samples of a signal that carries the first data as the signal transitions between high and low values.

11. A receiver comprising:
    a first sampler configured to sample a signal;
    a second sampler configured to sample the signal;
    a clock and data recovery circuit communicatively coupled with the first sampler and the second sampler, the clock and data recovery circuit configured to:
    receive first data from the first sampler;
    receive second data from the second sampler; and
    determine a clock adjustment signal based on either a boundary of the first data, a boundary of the second data, or both;
    offset logic communicatively coupled with the clock and data recovery circuit, the first sampler, and the second sampler, the offset logic configured to:
    determine a first average value from the boundary of the first data over a first selected period of time;
    send a first offset signal to the first sampler based on the first average value;
    determine a second average value from the boundary of the second data over a second selected period of time; and
    send a second offset signal to the second sampler based on the second average value; and a clock generator communicatively coupled with the clock and data recovery circuit, the first sampler, and the second sampler, the clock generator configured to:
    generate a data clock based on the clock adjustment signal;
    generate a boundary clock that is out of phase with the data clock;
    send the data clock to the first sampler; and
    send the boundary clock to the second sampler.

12. The receiver according to claim 11, wherein the offset logic is further configured to send a third offset signal to the first sampler based on the first average value.

13. The receiver according to claim 11, wherein:
the clock generator is further configured to send the data clock to the second sampler and to send the boundary clock to the first sampler; and
the offset logic is configured to:
    determine a third average value of the first data over a selected period of time; and
    send a third offset signal to the first sampler based on the third average value.

14. The receiver according to claim 13, wherein the offset logic is further configured to send a fourth offset signal to the second sampler based on the third average value.

15. The receiver according to claim 11, wherein the clock generator is further configured to
    simultaneously send the data clock to the second sampler and the first sampler.

16. The receiver according to claim 11, wherein the clock and data recovery circuit is further configured to determine the clock adjustment signal based on a first portion of the first data and a first portion of the second data; and after a period of time, determine the clock adjustment signal based on a second portion of the first data and a second portion of the second data.

* * * * *